(12) United States Patent
Hong et al.

(10) Patent No.: US 9,825,634 B2
(45) Date of Patent: Nov. 21, 2017

(54) LEVEL SHIFTING CIRCUIT AND METHOD FOR THE SAME

(71) Applicant: Magnachip Semiconductor, Ltd., Cheongju (KR)

(72) Inventors: Seok Min Hong, Seongnam (KR); Tae Kyoung Kang, Cheongju (KR); Jun Sik Min, Cheongju (KR)

(73) Assignee: MagnaChip Semiconductor, Ltd. (KR)

( * ) Notice: Subject to any disclaimer, the term of this patent is extended or adjusted under 35 U.S.C. 154(b) by 0 days.

(21) Appl. No.: 15/209,213

(22) Filed: Jul. 13, 2016

(65) Prior Publication Data

US 2017/0026042 A1    Jan. 26, 2017

(30) Foreign Application Priority Data

Jul. 24, 2015 (KR) .................. 10-2015-0104908

(51) Int. Cl.
*H03L 5/00* (2006.01)
*H03K 19/0185* (2006.01)
*H03K 3/356* (2006.01)

(52) U.S. Cl.
CPC ............... *H03K 19/018507* (2013.01); *H03K 3/356113* (2013.01)

(58) Field of Classification Search
CPC ........... H03K 3/356; H03K 19/018521; H03K 19/00315; H03K 17/102; H03K 3/012
USPC .................. 327/306, 333; 326/80–81, 61–62
See application file for complete search history.

(56) References Cited

U.S. PATENT DOCUMENTS

| | | | |
|---|---|---|---|
| 6,670,939 B2 | 12/2003 | Yang et al. | |
| 7,239,191 B2 * | 7/2007 | Lee .................. | H03K 3/356113 326/68 |
| 7,436,213 B2 * | 10/2008 | Nojiri .................... | H03K 3/012 326/68 |
| 8,319,540 B2 * | 11/2012 | Barrow ............ | H03K 3/356165 327/333 |

\* cited by examiner

*Primary Examiner* — Dinh T Le
(74) *Attorney, Agent, or Firm* — McGuireWoods LLP

(57) ABSTRACT

A level shifting circuit includes a transistor output unit that receives a first power supply signal and convert the first power supply signal to a second power supply signal having a different level from the first power supply signal and a current provision unit that provides a current to an output terminal of the transistor output unit when the first power supply signal of the transistor output unit is inputted to shorten a prolonged portion of the second power supply signal. Therefore, the level shifting circuit may provide an additional current to the output terminal of the transistor output unit to shorten a prolonged portion of the output voltage.

20 Claims, 4 Drawing Sheets

LEVEL SHIFTING CIRCUIT AND METHOD FOR THE SAME

CROSS-REFERENCE TO RELATED APPLICATIONS

This application claims the benefit under 35 USC 119 of Korean Patent Application No. 10-2015-0104908, filed on Jul. 24, 2015, in the Korean Intellectual Property Office, the entire disclosure of which is incorporated herein by reference for all purposes

BACKGROUND OF THE DISCLOSURE

1. Field

This disclosure relates to a level shifting circuit, more particularly, to a method of driving a level shifting circuit to shorten or remove a prolonged portion of an output voltage thereof.

2. Description of Related Art

A level shifting circuit converts an input signal having a prescribed voltage level to an output signal having a different voltage level. The level shifting circuit is disposed between two circuits that have different signal voltage levels. In one example of existing technology, when a gate-source voltage of a transistor exceeds a breakdown voltage of the gate oxide, the gate oxide of the transistor may become damaged and the transistor may not operate normally. This technology uses a block transistor to solve this problem. However, a delay may be generated by a parasitic capacitance of the block transistor, which may unnecessarily prolong the output voltage. Therefore, there is a need for a driving scheme which protects the gate oxide of a transistor and removes a delay of the output voltage in a level shifting circuit.

SUMMARY OF THE DISCLOSURE

One aspect of the present disclosure provides a level shifting circuit, which comprises a transistor output unit that receives a first power supply signal, converts the first power supply signal to a second power supply signal having a different level from the first power supply signal, and outputs the second power supply signal. The level shifting circuit may comprise a current provision unit that provides a current to an output terminal of the transistor output unit when the first power supply signal is inputted to the transistor output unit, to shorten a prolonged portion of the second power supply signal.

The current provision unit may receive a pulse signal when the first power supply signal is inputted to the transistor output unit, to provide an additional current to the output terminal.

The pulse signal may have a high level for a predetermined time period when the first power supply signal is inputted.

The prolonged portion of the second power supply signal may be shortened by an overlap of an output current according to the first power supply signal and an output current according to the pulse signal.

The current provision unit may receive a pulse signal for a predetermined time period when the first power supply signal is inputted to the transistor output unit, to provide an additional current to the output terminal for the predetermined time period.

The current provision unit may include a current output module having a current mirror structure. The current output module may comprise a first terminal connected to an output terminal of the transistor output unit.

The current provision unit may further include a block module connected to a second terminal of the current output module to prevent gate oxide breakdown of the current output module.

The current provision unit may include a pulse input module connected to the block module and selectively turned on or off based on a pulse signal to determine whether a current in respect of the output terminal of the transistor output unit is provided.

The block module may be disposed between the current output module and the pulse input module to prevent a gate-source voltage of the current output module from exceeding a predetermined voltage.

The current provision unit may be connected to the output terminal of the transistor output unit and may be formed in a bilateral symmetric configuration with respect to the transistor output unit.

The transistor output unit may include a plurality of output transistors arranged to form a latch structure and to be controlled according to an inversion operation by the latch structure.

The transistor output unit may further include a plurality of block transistors connected to the plurality of output transistors to prevent gate oxide breakdown of one or more of the plurality of output transistors.

The transistor output unit may include a plurality of input transistors connected to the plurality of block transistors and selectively turned on or off based on the first power supply signal to control driving of the plurality of output transistors.

The plurality of block transistors may be disposed between the plurality of output transistors and the plurality of input transistors to prevent a gate-source voltage of the plurality of output transistors from exceeding a predetermined voltage.

According to another aspect of the disclosure, a level shifting method includes inputting a first power supply signal to a transistor output unit. A pulse signal may be inputted to a current provision unit that is connected to an output terminal of the transistor output unit when the first power supply signal is inputted to the transistor output unit. An additional current may be provided to the output terminal based on the pulse signal. An output current according to the first power supply signal and an output current according to the pulse signal are overlapped to output a second power supply signal having a different level from the first power supply signal.

The inputting of the pulse signal may include inputting a pulse signal having a high level for a predetermined time period when the first power supply signal is inputted to the transistor output unit.

The providing the additional current may include providing the additional current to the output terminal for a predetermined time period when the first power supply signal is inputted to the transistor output unit to shorten a prolonged portion of the second power supply signal.

According to yet another aspect of the disclosure, a level shifting circuit includes a transistor output unit having an input terminal receiving a first power supply signal and an output terminal outputting a second power supply signal generated based on the first power supply signal. The second power supply signal may have a different level from the first power supply signal. The level shifting circuit may include a current provision unit connected and providing a current to the output terminal of the transistor output unit when the first power supply signal is inputted to the transistor output unit to shorten a prolonged portion of the second power supply signal.

The current provision unit may include a current output module connected to the output terminal of the transistor output unit, a block module connected to the current output module to prevent gate oxide breakdown of the current output module, and a pulse input module connected to the block module and selectively turned on or off based on a pulse signal provided thereto.

The current provision unit may include a plurality of output transistors arranged to form a latch structure, a plurality of block transistors connected to the plurality of output transistors to prevent gate oxide breakdown of one or more of the plurality of output transistors, and a plurality of input transistors connected to the plurality of block transistors and selectively turned on or off based on the first power supply signal to control driving of the plurality of output transistors.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

Figure 1:
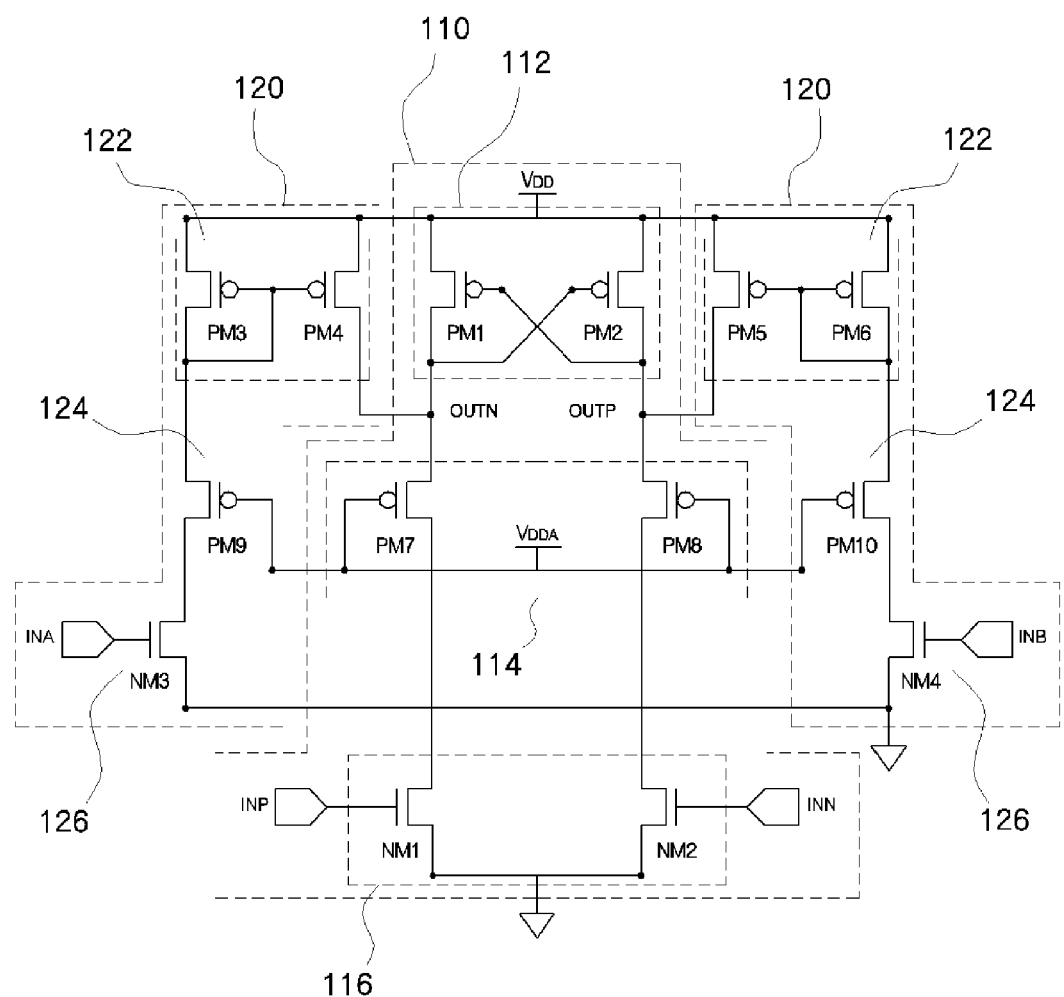
FIG. 1 is a circuit diagram illustrating a level shifting circuit according to an example of the present disclosure.

The present disclosure is further described in the detailed description that follows.

DETAILED DESCRIPTION OF THE DISCLOSURE

The following detailed description is provided to assist the reader in gaining a comprehensive understanding of the methods, apparatuses, and/or systems described herein. The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Various changes, modifications, and equivalents of the systems, apparatuses and/or methods described herein will be apparent to one of ordinary skill in the art. Moreover, it is noted that like reference numerals represent similar parts throughout the several views of the drawings.

While terms such as "first," "second," and the like, may be used to describe various components, such components must not be understood as being limited to the terms. The terms are merely used to help the reader to distinguish one component from another.

It will be understood that when an element is referred to as being "connected to" or "connected with" another element, the element can be directly connected to the other element or intervening elements may also be present. In addition, unless explicitly described to the contrary, the word "comprise" and variations such as "comprises" or "comprising," or synonyms such as "including" or "having," will be understood to imply the inclusion of stated elements but not the exclusion of any other elements. Meanwhile, other expressions describing relationships between components such as "between," "immediately between" or "adjacent to" and "directly adjacent to" may be construed similarly.

Singular forms "a," "an" and "the" in the present disclosure are intended to include the plural forms as well, unless the context clearly indicates otherwise.

Devices that are in communication with each other need not be in continuous communication with each other, unless expressly specified otherwise. Devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

FIG. 1 is a circuit diagram illustrating an example of a level shifting circuit constructed according to the principles of the disclosure.

Referring to FIG. 1, a level shifting circuit 100 may include a transistor output unit 110, a current provision unit 120, and the like.

The transistor output unit 110 may receive one or more first power supply signals, such as, for example, first power supply signals $V_{INP}$, $V_{INN}$, and convert the first power supply signals $V_{INP}$, $V_{INN}$ to one or more second power supply signals, such as, for example, second power signals $V_{OUTP}$, $V_{OUTN}$, respectively, which may have different level from the first power supply signals $V_{INP}$, $V_{INN}$, respectively. The first power supply signals $V_{INP}$, $V_{INN}$ may be inputted to input terminals INP, INN of the transistor output unit 110. The second power supply signals $V_{OUTN}$, $V_{OUTP}$ may be outputted to output terminals OUTN, OUTP of the transistor output unit 110. The level shifting circuit 100 may be disposed between circuits which have different power supply levels to convert the power being transmitted from one of the circuits to a power supply level suitable for the other circuit.

In one embodiment, the transistor output unit 110 may include a plurality of output transistors 112, a plurality of block transistors 114, a plurality of input transistors 116, and/or the like.

The plurality of output transistors 112 may be arranged to form a latch structure and may be controlled by inversion operations of the latch structure. For example, the plurality of output transistors 112 may include first and second PMOS transistors PM1, PM2. A gate terminal of the first PMOS transistor PM1 may be connected to a drain terminal of the second PMOS transistor PM2, and a gate terminal of the second PMOS transistor PM2 may be connected to the drain terminal of the first PMOS transistor PM1. The output terminals OUTN, OUTP may be connected to the drain terminals of first and second PMOS transistors PM1, PM2, respectively. Source terminals of the first and second PMOS transistors PM1, PM2 may receive a first external power supply $V_{DD}$. The first external power supply $V_{DD}$ may range, for example, between about 5 V and about 37.5 V.

The plurality of block transistors 114 may prevent gate oxide breakdown in one or more of the plurality of output transistors 112. For example, the plurality of block transistors 114 may be disposed between the plurality of output transistors 112 and the plurality of input transistors 116 to prevent a gate-source voltage $V_{GS}$ of one or more of the plurality of output transistors 112 from exceeding a predetermined voltage level, for example, a gate oxide breakdown voltage, to protect the plurality of output transistors 112. The plurality of block transistors 114 may include seventh and eighth transistors PM7, PM8, which may be high voltage transistors constructed to withstand a breakdown voltage of, for example, about 45 V.

The plurality of input transistors 116 may be connected to the plurality of block transistors 114 and may be turned on or off based on the first power supply signals $V_{INP}$, $V_{INN}$ to control driving of the plurality of output transistors 112. For example, the plurality of input transistors 116 may include first and second NMOS transistors NM1, NM2 which may be high voltage transistors constructed to withstand a breakdown voltage of, for example, about 45 V. The first power supply signals $V_{INP}$, $V_{INN}$ may be inputted to gate terminals of the first and the second NMOS transistor NM1, NM2, respectively, through the input terminals INP and INN, respectively. The first and second NMOS transistors NM1, NM2 may be turned on or turned off based on the first power supply signals $V_{INP}$, $V_{INN}$.

In one embodiment, a source terminal of the seventh PMOS transistor PM7 may be connected to a drain terminal of the first PMOS transistor PM1, and the source terminal of the eighth PMOS transistor PM8 may be connected to the drain terminal of the second PMOS transistor PM2. The drain terminal of the first NMOS transistor NM1 may by connected to the drain terminal of the seventh PMOS transistor PM7, and the drain terminal of the second NMOS transistor NM2 may be connected to the drain terminal of the eighth PMOS transistor PM8. The seventh and eighth PMOS transistors PM7, PM8 may receive a second external power supply $V_{DDA}$ through gate terminals thereof. The first external power supply $V_{DD}$ may range between, for example, about 0 V and about 32.5 V. When the plurality of block transistors 114 are turned on by the second external power supply $V_{DDA}$, a current path may be formed between the plurality of output transistors 112 and the plurality of input transistors 116, and the voltages at the drain terminals of the plurality of output transistors 112 may be differentiated from the voltages at the drain terminals of the plurality of input transistors 116. Hence, the plurality of block transistors 114 may prevent a gate-source voltage $V_{GS}$ of the plurality of output transistors 112 from exceeding the gate oxide breakdown voltage to protect the plurality of output transistors 112.

The current provision unit 120 may provide a current to the output terminals OUTN, OUTP of the transistor output unit 110 when the first power supply signals $V_{INP}$, $V_{INN}$ are inputted to the input terminals INP, INN of the transistor output unit 110 to shorten a prolonged portion of the second power supply signals $V_{OUTN}$, $V_{OUTP}$.

The prolonged portion of the second power supply signals $V_{OUTN}$, $V_{OUTP}$ may be shortened by overlapping of the output current according to the first power supply signals $V_{INP}$, $V_{INN}$ and the output current according to pulse signals $V_{INA}$, $V_{INB}$. The output current according to the first power supply signals $V_{INP}$, $V_{INN}$ may correspond to the source-drain current $I_{SD}$ of the first and second PMOS transistors PM1, PM2 and the output current according to the pulse signal $V_{INA}$, $V_{INB}$ may correspond to the source-drain current $I_{SD}$ of the fourth and fifth PMOS transistors PM4, PM5. That is, the output currents of the first and fourth PMOS transistors PM1, PM4 may be overlapped at the output terminal OUTN and the output currents of the second and fifth PMOS transistors PM2, PM5 may be overlapped at the output terminal OUTP.

The current provision unit 120 may include a current output module 122, a block module 124, a pulse input module 126, and the like.

The current output module 122 may include a current mirror structure. For example, output terminals of the current output module 122 may be connected to the output terminals OUTN, OUTP of the transistor output unit 110, respectively. In one embodiment, the current output module 122 may include third and fourth PMOS transistors PM3, PM4. The gate terminal of the third and fourth PMOS transistors PM3, PM4 may be connected to each other and may additionally be connected to the drain terminal of the third PMOS transistor PM3. The current output module 122 may include a current mirror structure to turn on the fourth PMOS transistor PM4 based on the pulse signal $V_{INA}$, $V_{INB}$ inputted to the pulse input module 126 connected to the third PMOS transistor PM3. Therefore, the fourth PMOS transistors PM4 may pass an identical current with the source-drain current $I_{SD}$ of the third PMOS transistor PM3. The fourth PMOS transistor PM4 may be connected to the output terminal OUTN and may provide the source-drain current $I_{SD}$ to the output terminal OUTN. The source terminals of the third and fourth PMOS transistors PM3, PM4 may receive the first external power supply $V_{DD}$.

The block module 124 may be connected to the other terminal of the current output module 122 to prevent the gate oxide breakdown of the current output module 122. The block module 124 may be disposed between the current output module 122 and the pulse input module 126 to prevent the gate-source voltage $V_{GS}$ of the current output module 122 from exceeding a predetermined voltage. Herein, the predetermined voltage may be the breakdown voltage of the gate oxide. Therefore, the block module 124 may prevent the gate-source voltage $V_{GS}$ of the current output module 122 from exceeding the gate oxide breakdown voltage to protect the current output module 122. In one embodiment, the block module 124 may be embodied in the ninth PMOS transistor PM9.

The pulse input module 126 may be connected to the block module 124 and may be turned on or off based on the pulse signal $V_{INA}$, $V_{INB}$ to determine whether the currents in respect of the output terminals OUTN, OUTP of the transistor output unit 110 are provided. In one embodiment, the pulse input module 126 may be embodied in the third NMOS transistor NM3. The pulse signal $V_{INA}$ may be inputted to the gate terminal of the third NMOS transistor NM3 through an input terminal INA. The third NMOS transistor NM3 may be turned on or off according to whether or not the pulse signal $V_{INA}$ is supplied to control a flow of the source-drain current $I_{SD}$.

The source terminal of the ninth PMOS transistor PM9 may be connected to the drain terminal of the third PMOS transistor PM3 and the drain terminal of the ninth PMOS transistor PM9 may be connected to the drain terminal of the third NMOS transistor NM3. Herein, the ninth PMOS transistor PM9 may receive the second external power supply $V_{DDA}$ through the gate terminal thereof to maintain the turn-on state. Therefore, the block module 124 may maintain the turn-on state to form a current path between the current output module 122 and the pulse input module 126 and may differentiate voltages of the drain terminals of the current output module 122 and the pulse input module 126. That is, the block module 124 may prevent the gate-source voltage $V_{GS}$ from exceeding the gate oxide breakdown voltage to protect the current output module 122.

The current provision unit 120 may be connected to the output terminals OUTN, OUTP of the transistor output unit 110 and may be formed in a bilateral symmetric configuration in respect of the center of the transistor output unit 110. More specifically, the current provision unit 120 may be formed in the bilateral symmetric configuration arranged at both sides of the transistor output unit 110. For example, the current output module 122 arranged on the right side of the transistor output unit 110 may include fifth and sixth PMOS transistors PM5, PM6. The fifth and sixth PMOS transistors PM5, PM6 may perform functions identical or similar to those of the third and fourth PMOS transistors PM3, PM4. The fourth PMOS transistor PM4 may provide the source-drain current $I_{SD}$ to the output terminal OUTN and the fifth PMOS transistor PM5 may provide the source-drain current $I_{SD}$ to the output terminal OUTP.

The block module 124 on the right side of the transistor output unit 110 may further include a tenth PMOS transistor PM10 and the tenth PMOS transistor PM10 may perform functions identical or similar to those of the ninth PMOS transistor PM9.

The pulse input module 126 on the right side of the transistor output unit 110 may further include a fourth NMOS transistor NM4 and the fourth NMOS transistor NM4 may perform functions identical or similar to those of the third NMOS transistor NM3. The gate terminal of the third NMOS transistor NM3 may be connected to the input terminal INA to receive the pulse signal $V_{INA}$ and the gate terminal of the fourth NMOS transistor NM4 may be connected to the input terminal INB to receive the pulse signal $V_{INB}$.

Figure 2:
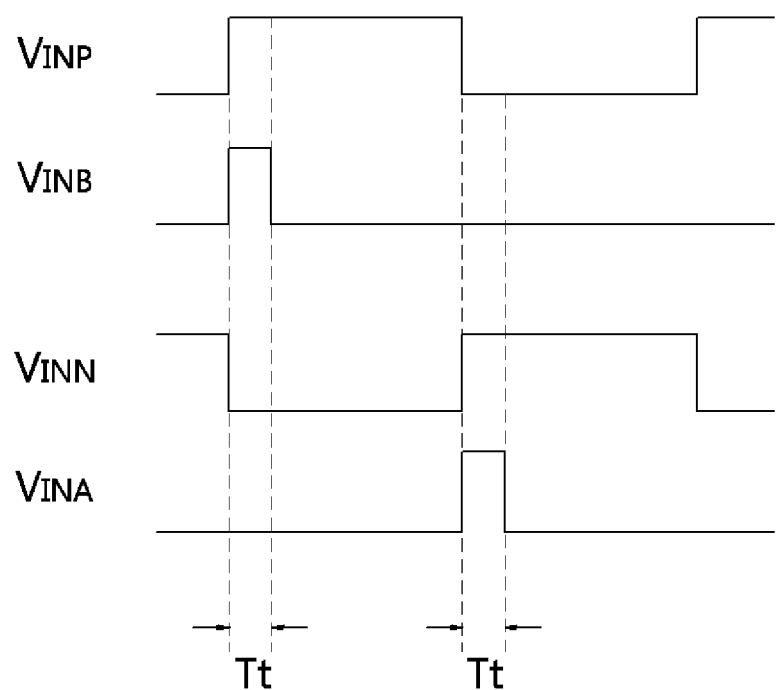
FIG. 2 is a waveform diagram illustrating a signal which is inputted to a level shifting circuit in FIG. 1.

FIG. 2 is a waveform diagram illustrating examples of operations of the level shifting circuit in FIG. 1.

Referring to FIG. 2, the current provision unit 120 may receive the pulse signal $V_{INA}$, $V_{INB}$ when the first power supply signals $V_{INP}$, $V_{INN}$ are inputted to the transistor output unit 110 to provide additional current to the output terminal OUTN, OUTP of the transistor output unit 110. The pulse signals $V_{INA}$, $V_{INB}$ may correspond to the power supply signal inputted to the input terminal INA, INB of the current provision unit 120. The pulse signals $V_{INA}$, $V_{INB}$ may maintain a high level for a time period Tt when the first power supply signals $V_{INP}$, $V_{INN}$ are inputted to the plurality of input transistors 116, respectively. That is, the current provision unit 120 may receive the pulse signals $V_{INA}$, $V_{INB}$ for the time period Tt when the first power supply signals $V_{INP}$, $V_{INN}$ are inputted to provide the additional current to the output terminals OUTN, OUTP of the transistor output unit 110 during the time period Tt.

The time period Tt may be predetermined to correspond to a transition time for providing necessary current to shorten the prolonged portion of the second power supply signal $V_{OUTN}$, $V_{OUTP}$. That is, the current provision unit 120 may receive the pulse signals $V_{INA}$, $V_{INB}$ during the transition time period Tt to provide the additional current to the output terminals OUTN, OUTP of the transistor output unit 110 and may remove a prolonged portion of the second power supply signals $V_{OUTN}$, $V_{OUTP}$, which is described below with reference to FIG. 3.

For example, in FIG. 1, the fourth NMOS transistor NM4 may receive the pulse signal $V_{INB}$ when the first power supply signal $V_{INP}$ is inputted to the first NMOS transistor NM1. When the first NMOS transistor NM1 is turned on by the first power supply signal $V_{INP}$, the second PMOS transistor PM2 may be turned on because the seventh PMOS transistor PM7 may stay turned on. Therefore, the source-drain current $I_{SD}$ of the second PMOS transistor PM2 may be provided to the output terminal OUTP of the transistor output unit 110.

However, when the fourth NMOS transistor NM4 is turned on by the pulse signal $V_{INB}$ with the first NMOS transistor NM1, the fifth and sixth PMOS transistors PM5, PM6 may be turned on because the tenth PMOS transistor PM10 may stay turned on. Therefore, the source-drain current $I_{SD}$ of the fifth PMOS transistor PM5 may be provided to the output terminal OUTP of the transistor output unit 110.

As a result, the second power supply signal $V_{OUTP}$ applied to the output terminal OUTP may be formed by overlapping of the source-drain current $I_{SD}$ of the second PMOS transistor PM2 according to the first power supply signal $V_{INP}$ and the source-drain current $I_{SD}$ of the fifth PMOS transistor PM5 according to the pulse signal $V_{INB}$. Therefore, the prolonged portion of the second power supply signal $V_{OUTP}$ may be shortened.

Figure 3:
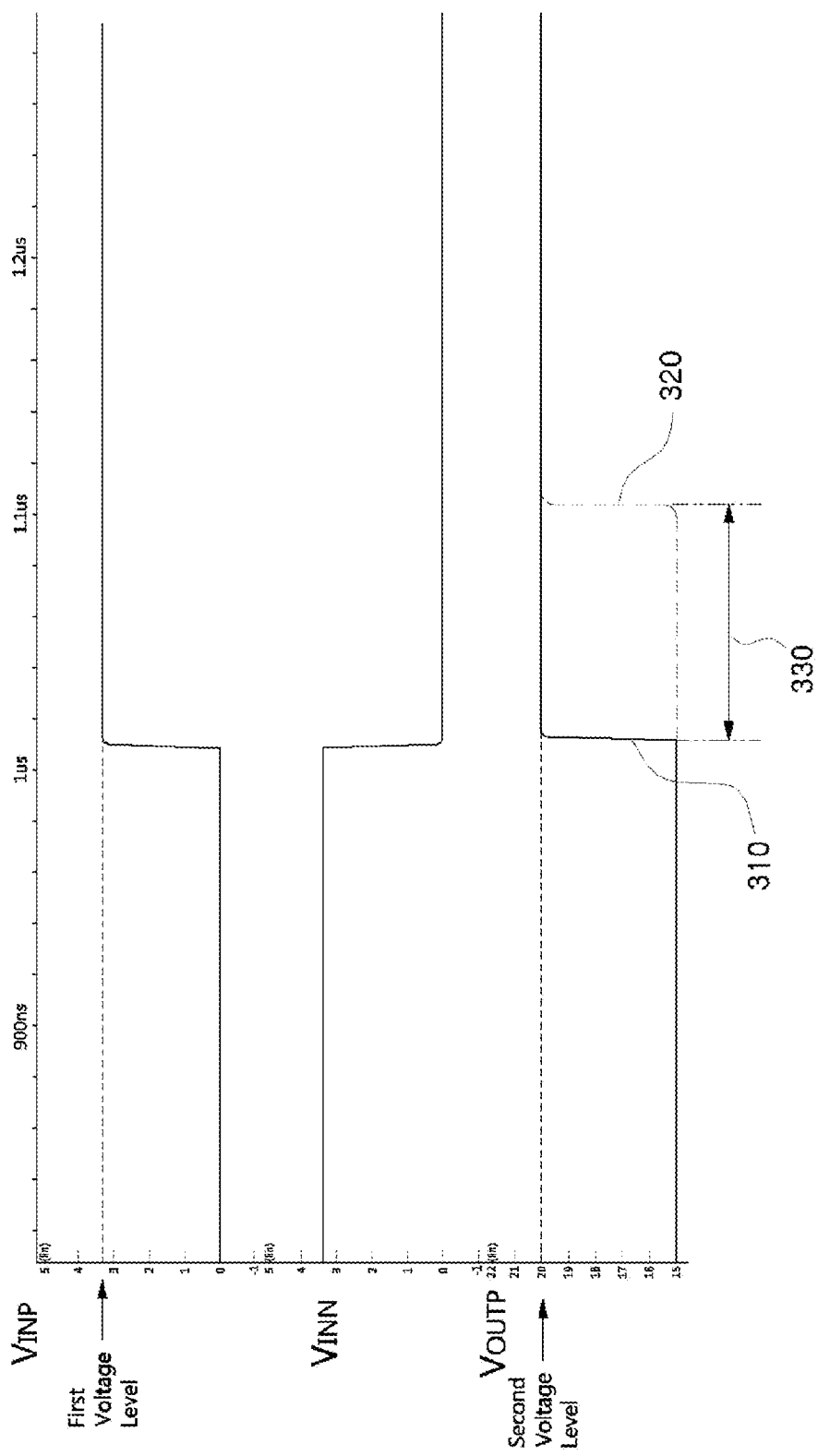
FIG. 3 is a waveform diagram illustrating a shortening of a prolonged portion in a level shifting circuit in FIG. 1.

FIG. 3 is a waveform diagram illustrating shortening of the prolonged portion in the level shifting circuit in FIG. 1.

Referring to FIG. 3, the level shifting circuit 100 may receive the first power supply signal $V_{INP}$ having a first voltage level to output the second power supply signal $V_{OUTP}$ having a second voltage level.

In one embodiment, the level shifting circuit 100 may provide the current to the output terminal OUTP when the first power supply signal $V_{INP}$ is inputted to the first NMOS transistor NM1 to remove a prolonged portion 330 of the second power supply signal 310, thereby shortening the duration of the second power supply signal $V_{OUTP}$.

On the other hand, the existing technology uses a block transistor to solve the gate oxide breakdown problem, but the output voltage 320 of the existing technology has the prolonged portion 330 that results from, for example, a parasitic capacitance of the block transistor.

Therefore, the second power supply signal 310 of the level shifting circuit 100 may have increased speed by as much as the prolonged portion 330, when compared to the output voltage 320 of the existing technology.

Figure 4:
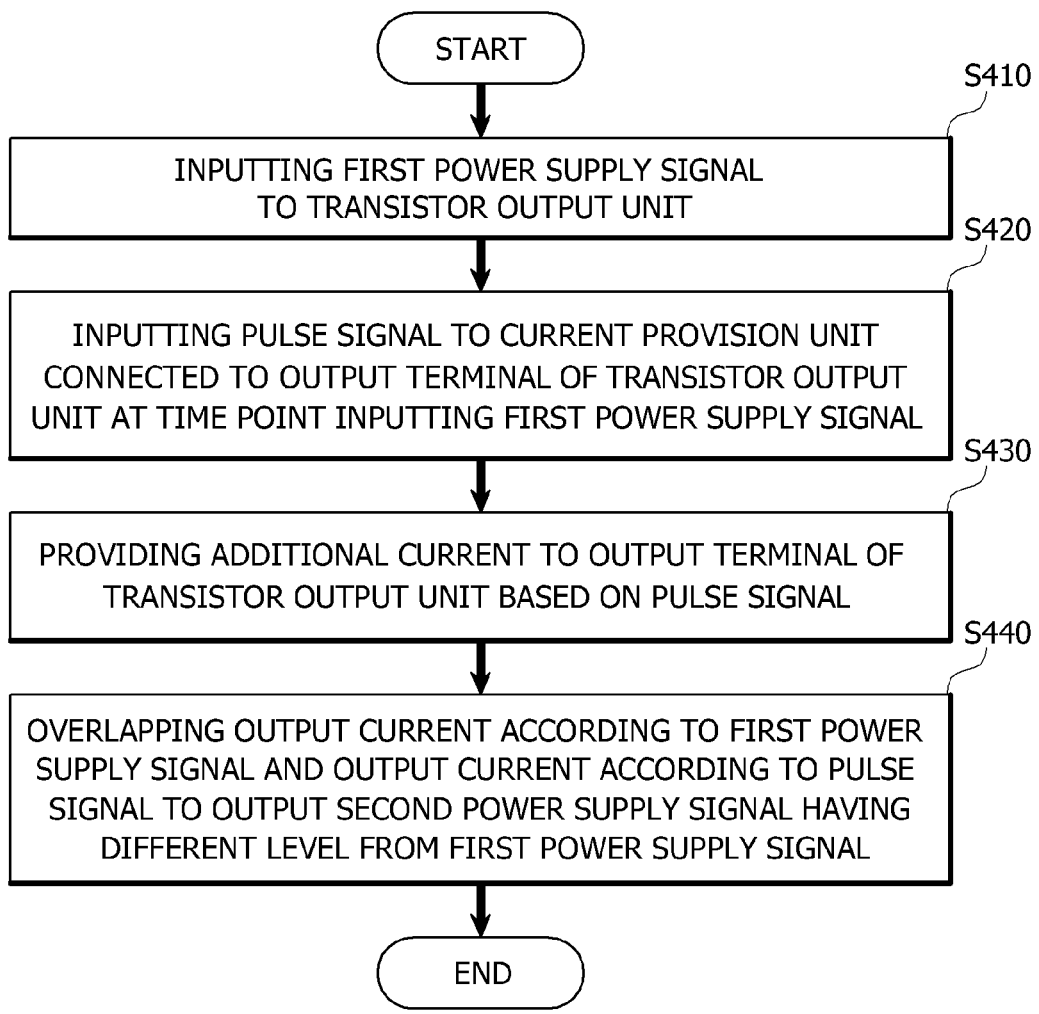
FIG. 4 is a flowchart illustrating a level shifting process which is performed in a level shifting circuit in FIG. 1.

FIG. 4 is a flowchart illustrating an example of a level shifting process which may be performed by, for example, the level shifting circuit 100 in FIG. 1.

The transistor output unit 110 may receive the first power supply signal $V_{INP}$, $V_{INN}$ (at step S410).

The current provision unit 120 may receive the pulse signals $V_{INA}$, $V_{INB}$ when the transistor output unit 110 receives the first power supply signals $V_{INP}$, $V_{INN}$ (at step S420). Herein, the output terminals of the current provision unit 120 may be connected to the output terminals OUTN, OUTP of the transistor output unit 110.

The current provision unit 120 may provide the additional current to the output terminals OUTN, OUTP of the transistor output unit 110 based on the pulse signals $V_{INA}$, $V_{INB}$ (at step S430).

The transistor output unit 110 may overlap the output current according to the first power supply signal $V_{INP}$, $V_{INN}$ and the output current according to the pulse signals $V_{INA}$, $V_{INB}$ to output the second power supply signal $V_{OUTN}$, $V_{OUTP}$ having the different level from the first power supply signal (at step S440).

Therefore, the level shifting circuit 100 may provide an additional current to the output terminals to shorten the prolonged portion of the output voltage. Also, the level shifting circuit 100 may receive the pulse signals to the other input terminals during the time period when the input power supply signals are inputted to the input terminals to provide the additional current to the output terminal of the level shifting circuit. That is, the level shifting circuit 100 may shorten the prolonged portion of the output voltage through the overlapping of the output current according to the input power supply signals and the output current according to the pulse signals.

While the disclosure has been described in terms of exemplary embodiments, those skilled in the art will recognize that the disclosure can be practiced with modifications in the spirit and scope of the appended claims. These examples are merely illustrative and are not meant to be an exhaustive list of all possible designs, embodiments, applications or modifications of the disclosure.

100: level shifting circuit
110: transistor output unit
112: plurality of output transistors
114: plurality of block transistors
116: plurality of input transistors
120: current provision unit
122: current output module
124: block module
126: pulse input module

What is claimed is:

1. A level shifting circuit, comprising:
a transistor output unit that receives a first power supply signal, converts the first power supply signal to a second power supply signal having a different level from the first power supply signal to an output terminal, and outputs the second power supply signal; and
a current provision unit comprising a current mirror that generates a first current based on an input pulse signal to provide the first current to the output terminal of the transistor output unit when the first power supply signal is inputted to the transistor output unit, to shorten a prolonged portion of the second power supply signal.

2. The level shifting circuit of claim 1, wherein the current provision unit receives the input pulse signal when the first power supply signal is inputted to the transistor output unit to provide the first current to the output terminal.

3. The level shifting circuit of claim 2, wherein the input pulse signal has a first level for a predetermined time period when the first power supply signal is inputted.

4. The level shifting circuit of claim 2, wherein the prolonged portion of the second power supply signal is shortened by an overlap of the first current and a second current according to the first power supply signal.

5. The level shifting circuit of claim 1, wherein the current provision unit receives the input pulse signal for a predetermined time period when the first power supply signal is inputted to the transistor output unit, to provide the first current to the output terminal for the predetermined time period.

6. The level shifting circuit of claim 1, wherein the current provision unit comprises a current output module having a current mirror structure, the current output module comprising a first terminal connected to an output terminal of the transistor output unit.

7. The level shifting circuit of claim 6, wherein the current provision unit further comprises a block module connected to a second terminal of the current output module to prevent a gate oxide breakdown of the current output module.

8. The level shifting circuit of claim 7, wherein the current provision unit further comprises a pulse input module that is connected to the block module and selectively turned on or off based on the input pulse signal to determine whether a current in respect of the output terminal of the transistor output unit is provided.

9. The level shifting circuit of claim 8, wherein the block module is disposed between the current output module and the pulse input module to prevent a gate-source voltage of the current output module from exceeding a predetermined voltage.

10. The level shifting circuit of claim 1, wherein the current provision unit is connected to the output terminal of the transistor output unit and is formed in a bilateral symmetric configuration with respect to the transistor output unit.

11. The level shifting circuit of claim 1, wherein the transistor output unit includes a plurality of output transistors arranged to form a latch structure and to be controlled according to an inversion operation by the latch structure.

12. The level shifting circuit of claim 11, wherein the transistor output unit further includes a plurality of block transistors connected to the plurality of output transistors to prevent a gate oxide breakdown of the plurality of output transistors.

13. The level shifting circuit of claim 12, wherein the transistor output unit further includes a plurality of input transistors connected to the plurality of block transistors and selectively turned on or off based on the first power supply signal to control driving of the plurality of output transistors.

14. The level shifting circuit of claim 13, wherein the plurality of block transistors are disposed between the plurality of output transistors and the plurality of input transistors to prevent a gate-source voltage of the plurality of output transistors from exceeding a predetermined voltage.

15. A level shifting method, comprising:
inputting a first power supply signal to a transistor output unit;
selectively inputting an input pulse signal to a current provision unit which comprises a current mirror is connected to an output terminal of the transistor output unit when the first power supply signal is inputted to the transistor output unit;
providing a first current to the output terminal based on the input pulse signal; and overlapping the first current and a second current according to the first power supply signal to output a second power supply signal having a different level from the first power supply signal.

16. The level shifting method of claim 15, wherein the input pulse signal has a first level for a predetermined time period when the first power supply signal is inputted to the transistor output unit.

17. The level shifting method of claim 15, wherein the providing the first current includes providing the first current to the output terminal for a predetermined time period when the first power supply signal is inputted to the transistor output unit to shorten a prolonged portion of the second power supply signal.

18. A level shifting circuit, comprising:
   a transistor output unit comprising an input terminal receiving a first power supply signal and an output terminal outputting a second power supply signal generated based on the first power supply signal, the second power supply signal having a different level from the first power supply signal and a prolonged portion; and
   a current provision unit comprising a current mirror, connected and selectively providing a current to the output terminal of the transistor output unit based on a pulse signal when the first power supply signal is inputted to the transistor output unit,
   wherein the current selectively provided to the output terminal of the transistor output unit shortens the prolonged portion of the second power supply signal, and
   wherein the current provision unit is connected to the output terminal of the transistor output unit and is formed in a bilateral symmetric configuration with respect to the transistor output unit.

19. The level shifting circuit of claim 18, wherein the current provision unit comprises:
   a current output module connected to the output terminal of the transistor output unit;
   a block module connected to the current output module to prevent a gate oxide breakdown of the current output module; and
   a pulse input module connected to the block module and selectively turned on or off based on the pulse signal provided thereto.

20. The level shifting circuit of claim 18, wherein the current provision unit comprises:
   a plurality of output transistors arranged to form a latch structure;
   a plurality of block transistors connected to the plurality of output transistors to prevent a gate oxide breakdown of the plurality of output transistors; and
   a plurality of input transistors connected to the plurality of block transistors and selectively turned on or off based on the first power supply signal to control driving of the plurality of output transistors.

* * * * *